(12) United States Patent
Tsuda et al.

(10) Patent No.: US 6,335,546 B1
(45) Date of Patent: Jan. 1, 2002

(54) NITRIDE SEMICONDUCTOR STRUCTURE, METHOD FOR PRODUCING A NITRIDE SEMICONDUCTOR STRUCTURE, AND LIGHT EMITTING DEVICE

(75) Inventors: Yuhzoh Tsuda, Tenri; Takayuki Yuasa, Nara-ken, both of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/364,768

(22) Filed: Jul. 30, 1999

(30) Foreign Application Priority Data

Jul. 31, 1998 (JP) .......................................... 10-216639

(51) Int. Cl.[7] .............................................. H01L 33/00
(52) U.S. Cl. ........................................... 257/94; 438/42
(58) Field of Search .................... 257/94, 103; 438/42, 438/44, 46, 47; 117/45, 902, 913

(56) References Cited

U.S. PATENT DOCUMENTS 5,727,008 A * 3/1998 Koga .......................... 372/43

OTHER PUBLICATIONS

Sunakaw et al. (1997) "Thick GaN crystal growth with low defect density by hydride vapor phase epitaxy" Ext. Abstract. (The 58th Autumn Meeting) *J. Soc. of Appl. Phys.* No. 1:266 2p–Q–15, (English abstract enclosed herewith).

Tanaka et al. (1997) "Reduced dislocation densities in selectivity–grown nitride materials" Ext. Abstract. (The 58th Autumn Meeting) *J. Soc. of Appl. Phys.* (1997) No. 1:265 2p–Q–14 (English abstract enclosed herewith).

Usui et al. (1997) "Thick GaN Epitaxial Growth with Low Dislocation Density by Hydride Vapor Phase Epitaxy" *Jpn. J. Appl. Phys.* 36(2), No. 7B:L899–L902.

* cited by examiner

*Primary Examiner*—Olik Chaudhuri
*Assistant Examiner*—Douglas A. Wille
(74) *Attorney, Agent, or Firm*—Morrison & Foerster LLP

(57) ABSTRACT

A nitride semiconductor structure includes: a substrate having a growth surface, a convex portion and a concave portion being formed on the growth surface; and a nitride semiconductor film grown on the growth surface. A cavity is formed between the nitride semiconductor film and the substrate in the concave portion.

15 Claims, 6 Drawing Sheets

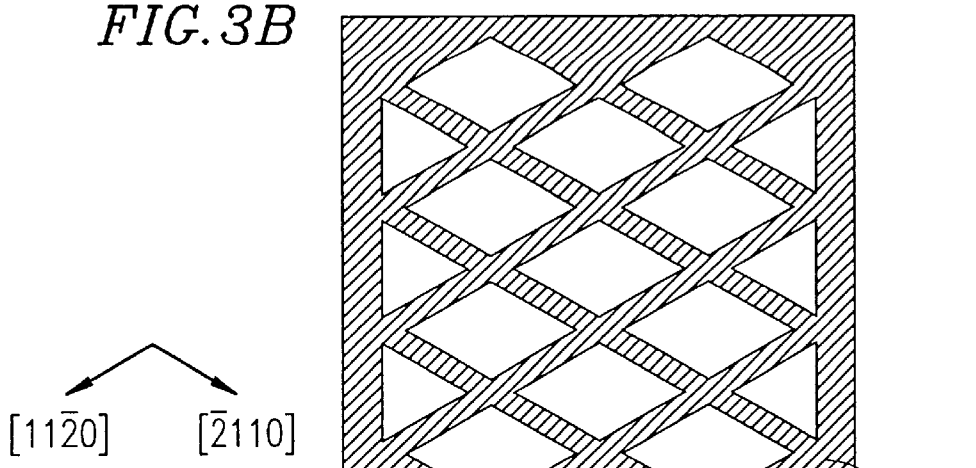
FIG. 3B
FIG. 3A
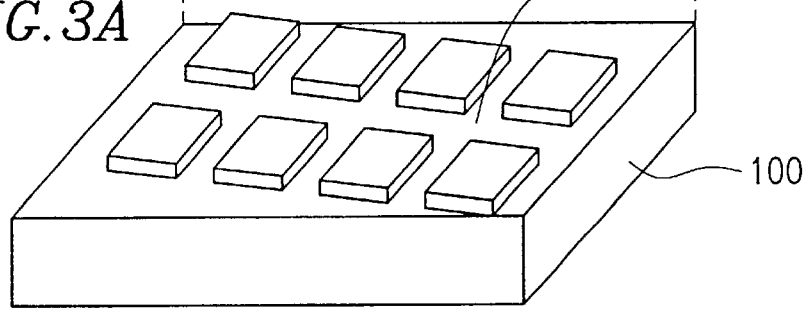
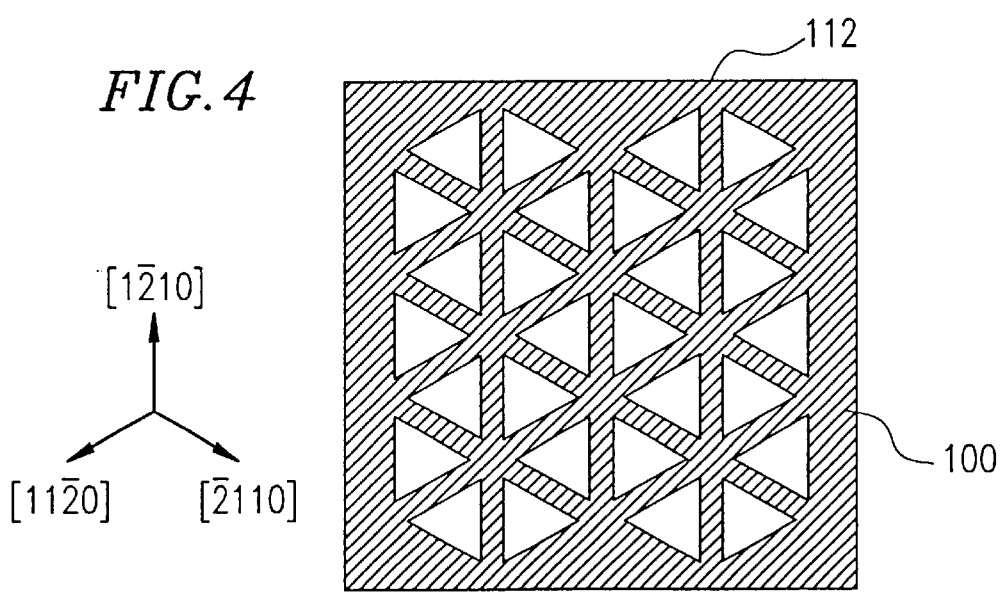
FIG. 4

NITRIDE SEMICONDUCTOR STRUCTURE, METHOD FOR PRODUCING A NITRIDE SEMICONDUCTOR STRUCTURE, AND LIGHT EMITTING DEVICE

BACKGROUND OF THE INVENTION

1. Field of the Invention

The present invention relates to a nitride semiconductor structure. In particular, the present invention relates to: a nitride semiconductor structure including a substrate for allowing crystal growth and a high-quality nitride semiconductor grown on the substrate for allowing crystal growth, the nitride semiconductor having a different lattice constant or a different thermal expansion coefficient from that of the substrate; a method for producing such a nitride semiconductor structure; and a light emitting device produced by employing such a nitride semiconductor structure.

2. Description of the Related Art

Conventionally, nitride semiconductors have been employed as materials for constructing blue light emitting diodes (referred to as "blue LEDs") or blue laser diodes (referred to as "blue LDs"). A nitride semiconductor is typically grown on a substrate by a metal-organic chemical vapor deposition (MOCVD) method, a hydride vapor phase epitaxy (HVPE) method, or a molecular beam epitaxy (MBE) method. In general, when a semiconductor is grown on a substrate, a substrate is used which is either of the same material as the semiconductor to be grown thereon or has a lattice constant and/or a thermal expansion coefficient similar to those of the semiconductor to be grown thereon.

It is impossible in the state of the art to prepare an appropriately-sized nitride semiconductor substrate which is of the same material as an overlying nitride semiconductor. Accordingly, a sapphire substrate, a SiC substrate, a spinel substrate, or the like is used as a substitute for a nitride semiconductor substrate. However, due to the large difference in lattice constant or thermal expansion coefficient between a nitride semiconductor and a sapphire substrate used as a substitute substrate, it is known that a nitride semiconductor film which has been grown directly on a sapphire substrate may contain threading dislocations at a density on the order of $10^9$ to $10^{10}$ cm$^{-2}$. Therefore, it has been difficult by allowing crystal growth directly on a substitute substrate to obtain satisfactory nitride semiconductor crystals, i.e., nitride semiconductor crystals having substantially no crystal defects or a substantially zero threading dislocation density.

As used herein, a "threading dislocation" is defined as a dislocation, particularly that occurring within a crystal or at an interface between crystals, that reaches the surface of the substrate.

Currently, a selective growth method is commonly adopted as a method for producing a nitride semiconductor film directly on a sapphire substrate because it is supposed to reduce the density of crystal defects or threading dislocations.

Hereinafter, a conventional method for producing a nitride semiconductor film will be described which utilizes selective growth of a nitride semiconductor.

In a first step, a first layer of a nitride semiconductor is formed directly on a sapphire substrate by using a MOCVD apparatus. In a second step, a SiO$_2$ layer is vapor deposited directly on the first layer of nitride semiconductor by using a chemical vapor deposition (CVD) method. In a third step, SiO$_2$ layer is processed so as to form a pattern having periodic openings by a known lithography technique. In a fourth step, the sapphire substrate which has undergone the third step is placed into a HVPE apparatus so as to grow a second layer of nitride semiconductor thereon. In accordance with this procedure, the density of threading dislocations (which would cause deterioration in the crystal quality) in the second layer of nitride semiconductor, which has been grown in the fourth step, is reduced to about 6×10$^6$ cm$^{-2}$. See Proceedings of 58th Applied Physics Association Lecture Meeting, 2p-Q-15 No. 1 (1997) p. 266"; or Jpn. J. Appl. Phys. Vol. 36(1997) p. L899. The reduction in the threading dislocation density is due to the selective growth of the nitride semiconductor on the SiO$_2$ masking pattern during the third step. Specifically, the second layer of nitride semiconductor which is grown directly on the masking pattern is more likely to develop in the openings of the masking pattern than in the portions where the SiO$_2$ layer remains.

The initial growth of the second layer of nitride semiconductor begins mainly in the openings. As the growth reaches the uppermost level of the SiO$_2$ layer, lateral growth begins so as to bury the SiO$_2$ masking layer, while the growth also continues along the direction perpendicular to the substrate. This lateral growth does not emanate from the underlying masking layer but rather from the nitride semiconductor crystals grown in the openings, which serve as growth cores. Therefore, the lateral growth is less susceptible to lattice mismatching.

Although the threading dislocations that are generated within the first layer of nitride semiconductor may intrude the second layer of nitride semiconductor through the openings in the masking layer, they are diverted by the lateral growth so as to proceed along the lateral direction. Consequently, few threading dislocations reach the uppermost surface of the nitride semiconductor, resulting in crystals having a low threading dislocation density.

Alternatively, it is also possible to form a SiO$_2$ masking pattern directly on a sapphire substrate and selectively grow a GaN monocrystalline film by MOCVD, as reported in Proceedings of 58th Applied Physics Association Lecture Meeting, 2p-Q-14 No. 1 (1997) p. 265. The technique described in this report omits the first step, so that a nitride semiconductor film is formed by only the second through fourth steps. This literature reports that the threading dislocation density directly above the SiO$_2$ is reduced to about 10$^5$ to about 10$^6$ cm$^{-2}$, as compared to the about 10$^9$ to about 10$^{10}$ cm$^{-2}$ threading dislocation density within the GaN monocrystalline film which is formed directly (i.e., in the openings of the SiO$_2$ masking layer) on the sapphire substrate.

The above-described techniques for producing a nitride semiconductor film were expected to reduce the threading dislocations within the nitride semiconductor film and to improve the emission characteristics and quality of a nitride semiconductor light emitting device formed directly on the nitride semiconductor film.

However, although the above-described nitride semiconductor film-producing techniques may reduce the threading dislocations within the resultant nitride semiconductor film, they employ at least three steps for forming a nitride semiconductor film having such a reduced threading dislocation density. In addition, it is necessary to change apparatuses from the first step to the second step, or from the second step to the fourth step.

In particular, the first conventional technique, which involves the first through fourth steps as described above, requires two steps of crystal growth. In general, any regrowth step which is performed after suspension of a previous growth is accompanied by the problem of impurity deposition on the crystal surface. This impurity concern is particularly great for the first conventional technique because the SiO$_2$ layer deposited in the second step is patterned. Moreover, the GaN layer which is utilized as a thick second layer of nitride semiconductor is grown at a growth temperature of about 1000° C., thereby leaving the SiO$_2$ masking pattern which is formed in the third step quite susceptible to thermal damage. The inventors have discovered through experimentation that Si or O$_2$ present in a thermally damaged masking pattern may unfavorably affect the resultant nitride semiconductor film.

When a nitride semiconductor light emitting device is produced directly on a nitride semiconductor film which has been formed by any conventional nitride semiconductor film-producing technique, impurities which have been formed as a result of the thermal damage to the masking pattern may influence an active layer of the nitride semiconductor light emitting device structure for generating light. Such influence may result in a decrease in the light emission efficiency of the individual light emitting devices, low product reliability due to light emission efficiency variation with respect to a number of light emitting devices, and/or a low production yield of nitride semiconductor light emitting devices.

SUMMARY OF THE INVENTION

A nitride semiconductor structure includes: a substrate having a growth surface, a convex portion and a concave portion being formed on the growth surface; and a nitride semiconductor film grown on the growth surface, wherein a cavity is formed between the nitride semiconductor film and the substrate in the concave portion.

In one embodiment of the invention, the convex portion and the concave portion are defined by a plurality of parallel grooves.

In another embodiment of the invention, the plurality of grooves have a width b and a depth h such that b≦about 10 μm and h≧0.2×b, and adjoining one of the plurality of grooves are spaced apart from each other so as to retain a distance of about 20 μm or less between center lines thereof.

In still another embodiment of the invention, the plurality of grooves have a width b and a depth h such that b≦about 10 μm and h≧b, and adjoining one of the plurality of grooves are spaced apart from each other so as to retain a distance of about 20 μm or less between center lines thereof.

In still another embodiment of the invention, the plurality of grooves are formed along a <1-100> direction of the nitride semiconductor.

In still another embodiment of the invention, the grooves are formed so as to extend along a cleavage plane or an etching stable plane of the substrate.

In still another embodiment of the invention, the growth surface of the substrate is composed essentially of a nitride semiconductor, the plurality of grooves being formed along a <11-20> direction of the nitride semiconductor.

In another aspect of the invention, there is provided a method for producing a nitride semiconductor structure including the steps of: forming a convex and a concave portion or a plurality of grooves on a growth surface of a substrate; and thereafter growing a nitride semiconductor film on the growth surface of the substrate so that a cavity is formed in the concave portion.

In yet another aspect of the invention, there is provided a light emitting device including: any one of the above nitride semiconductor structures; and a light emitting structure formed on the nitride semiconductor structure, the light emitting structure including an active layer including a nitride semiconductor.

Thus, the invention described herein makes possible the advantages of (1) providing a nitride semiconductor structure including a substrate and a high-quality nitride semiconductor film epitaxially grown thereon, the substrate having a different lattice constant or a different thermal expansion coefficient from that of the nitride semiconductor; (2) providing a method for producing such a nitride semiconductor structure; and (3) providing a light emitting device incorporating such a nitride semiconductor structure.

These and other advantages of the present invention will become apparent to those skilled in the art upon reading and understanding the following detailed description with reference to the accompanying figures.

BRIEF DESCRIPTION OF THE DRAWINGS

FIGS. 3A and 3B are a perspective view and a plan view, respectively, of a processed substrate according to Example 2 of the present invention.

FIG. 4 is a plan view illustrating a processed substrate according to Example 3 of the present invention.

DESCRIPTION OF THE PREFERRED EMBODIMENTS

Hereinafter, the principles of the present invention will be described with reference to FIG. 8.

Figure 8:
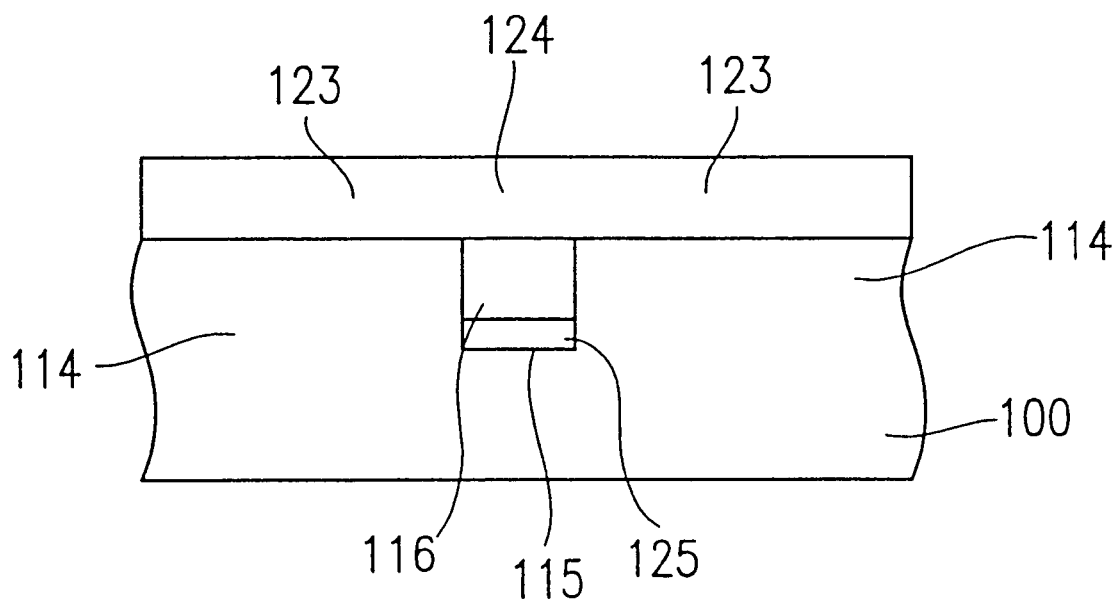
FIG. 8 is a cross-sectional view illustrating a crystal growth method according to the present invention.

As shown in FIG. 8, a processed substrate 100 includes grooves 115 (note that only one groove is illustrated for the sake of illustration). As a result, convex portions 114 are formed on the substrate surface in a complementary manner. A nitride semiconductor film is formed over the processed substrate 100, resulting in a nitride semiconductor film 123 which extends upon the convex portions 114, as well as a nitride semiconductor layer 124 which extends above the groove 115. The groove 115 is not filled all the way up with the nitride semiconductor 125 that is deposited at the bottom of the groove 115. Rather, a cavity 116 is left in the groove 115 which is void of any nitride semiconductor.

By employing such a grooved substrate, the difference in level between the groove 115 and the convex portions functions so that the nitride semiconductor film 123, which is grown directly on the convex portions 114 adjoining the groove 115, laterally grows from either side to finally meet in the middle before the groove 115 is filled up with the nitride semiconductor 125. The lateral growth of the nitride semiconductor 123 results in the formation of the nitride semiconductor film 124 above the groove 115. Accordingly, the cavity 116 which is free of any nitride semiconductor is left in the groove 115. The nitride semiconductor 124 above the groove 115 (which is a product of the lateral growth of the nitride semiconductor 123 from the convex portions 114) is not under any influence from the processed substrate 100 (e.g., stress-induced strain due to lattice mismatching and/or difference in thermal expansion coefficient). The presence of the nitride semiconductor film 124, which substantially escapes the influence from the substrate, makes it possible to relax the stress-induced strain in the nitride semiconductor film 123 on the convex portions 114 due to any lattice mismatching and/or difference in thermal expansion coefficient between the nitride semiconductor film 124 and the processed substrate 100. Thus, by utilizing the lateral crystal growth and effecting crystal growth while controlling the effects of various stresses, the threading dislocations which extend vertically from the substrate to the crystal surface can be reduced as compared to the case of growing crystals on a flat surface. Furthermore, in the case of forming a thick nitride semiconductor film, cracks can be minimized due to the reduced stress, unlike in the prior art.

In order to ensure that this effect permeates the entire nitride semiconductor film, it is necessary to provide enough grooves 115 per unit area (i.e., so as to have a sufficiently high "groove density"). The inventors have confirmed through experimentation that the effects of the invention are attained where adjoining grooves are spaced apart by about 20 μm or less. In particular, the strain resulting from various differences between the substrate and the nitride semiconductor film depends on the groove density. The effects of strain relaxation can be maximized by increasing the groove density. On the other hand, if adjoining grooves are spaced apart by about 20 μm or more, the resultant nitride semiconductor film may have a threading dislocation density which is substantially the same as that of a nitride semiconductor film which is formed on a conventional flat substrate.

Successful formation of the cavities 116 largely depends on the configuration of the grooves 115 because the cavities 116 are formed due to the relative readiness of the lateral growth from the nitride semiconductor film 123 (which is grown directly on the convex portions 114) as compared to the growth of the nitride semiconductor 125 within the grooves 115. The inventors have confirmed that it is preferable that the grooves 115 have a width b of about 10 μm or less and a depth h such that h≦0.2×b.

By employing an increased groove depth h such that h≦b, substantially no crystal growth material is supplied to the bottoms of the grooves 115, resulting in virtually no deposition of nitride semiconductor 125. In this case, the formation of the cavities 116 is greatly facilitated irrespective of crystal growth conditions, and the effects of strain relaxation can be further enhanced.

By forming the grooves 115 on the substrate surface so as to extend along the <1-100> direction of the nitride semiconductor, the resultant grooves 115 are oriented perpendicular to a direction along which the lateral growth occurs most rapidly (hereinafter this direction will be referred to as the "rapid lateral growth direction"). As a result, the lateral growth from the nitride semiconductor film 123 on the convex portions 114 can be further promoted, thereby enhancing the effects of the present invention. The inventors have confirmed through experimentation that GaN semiconductor laterally grows on the substrate so as to extend along the [11-20] direction of the GaN.

By forming grooves 115 so that their side walls constitute a cleavage plane of the substrate, the processing of the grooves 115 is facilitated. As a result, it becomes possible to form the grooves 115 so as to have a steep configuration, thereby providing for a more defined difference in level between the grooves 115 and the convex portions 114, while being able to form the grooves 115 so as to have a groove depth which is greater than the groove width.

In the present specification, grooves will be illustrated as specific instances of concavity. As used herein, a "groove" is defined merely as a linear stretch of concavity. A "processed substrate" is defined as a substrate having convex/concave portions or grooves formed on its surface. A "cleavage direction" of a substrate is defined as a direction parallel to the cleavage plane of the substrate.

Hereinafter, the present invention will be described by way of specific examples.

EXAMPLE 1

Figure 1:
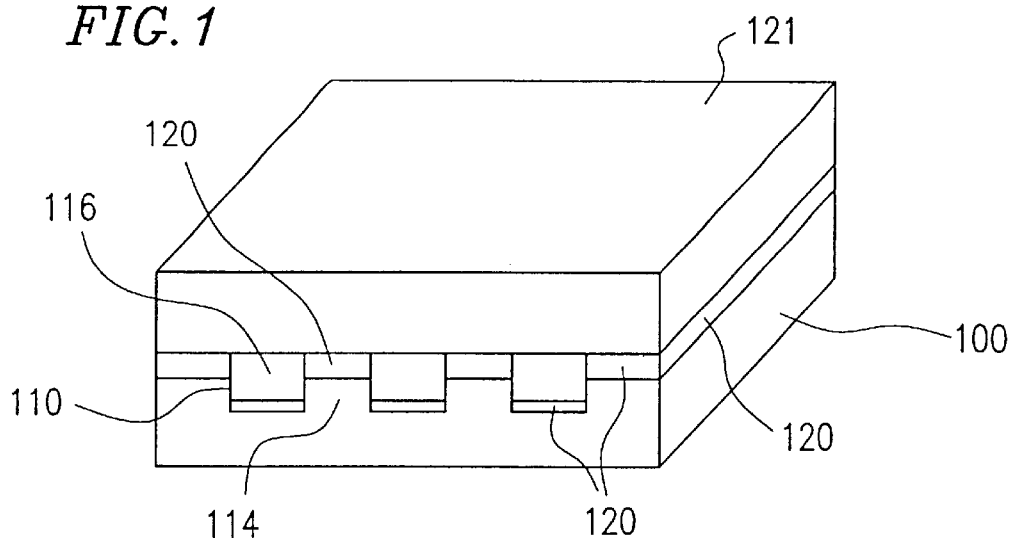
FIG. 1 is a perspective view illustrating a nitride semiconductor structure according to Example 1 of the present invention.

FIG. 1 is a perspective view illustrating a nitride semiconductor structure having laminated thereon a n-GaN film which has been produced according to the present example. The nitride semiconductor structure according to the present example includes a processed substrate 100, which is obtained by forming grooves 110 on a C plane of a sapphire substrate so as to extend along the [11-20] direction of the sapphire substrate (i.e., the [1-100] direction of the GaN film). A GaN buffer layer 120 is formed on convex portions 114 of the processed substrate 100. A n-GaN film 121 is grown over the entire surface of the processed substrate 100 so as to have a thickness of about 9 μm.

Figure 2B:
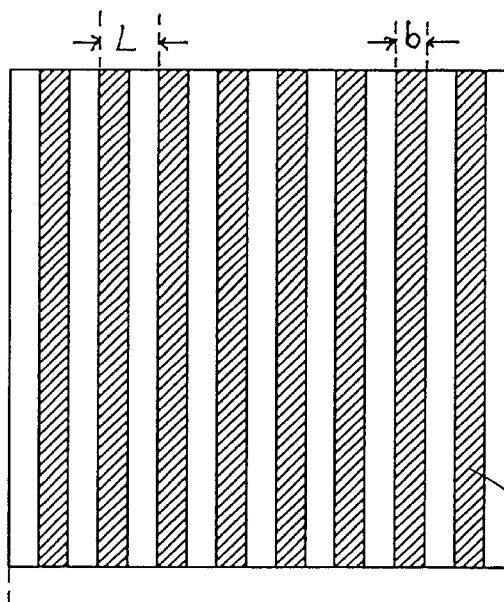
FIGS. 2A and 2B are a perspective view and a plan view, respectively, of a processed substrate according to Example 1 of the present invention.
Figure 2A:
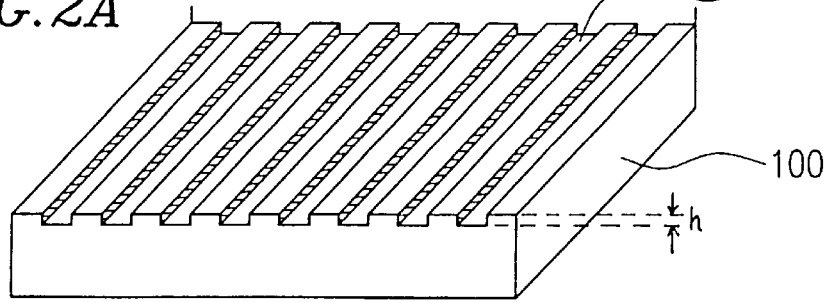

First, a method for producing the processed substrate 100 according to the present example will be described. The C plane of a sapphire substrate was used as a growth surface for allowing crystal growth thereon. FIGS. 2A and 2B are a perspective view and a plan view, respectively, of the processed substrate 100. The processed substrate 100 shown in FIGS. 2A and 2B was produced by the following method.

First, a resist was applied on the surface of the sapphire substrate, and exposed to UV (ultraviolet) rays. Then, portions other than the portions which had been cured through the UV exposure were lifted off, thereby leaving a resist pattern. These steps can be performed in accordance with a well-known photolithography technique. Thereafter, the sapphire substrate with the resist pattern was subjected to a wet etching. The grooves 110 formed on the sapphire substrate surface had a width b of about 6 μm, a depth h of about 2 μm, and a groove pitch L of about 12 μm. The grooves 110 were formed so as to extend along the [11-20] direction of the sapphire substrate. In general, a sapphire substrate is known to have the M plane (i.e., {1-100} plane) among its cleavage planes. Therefore, the C plane of a sapphire substrate is susceptible to cleavage along the [11-20] direction.

Instead of using the above-described photolithograpy technique, the processed substrate 100 can be produced by, for example, a scribing method, a wire saw method, a discharge processing, a sputtering method, a laser processing, a sandblast processing, or a focus ion beam (FIB) method to form the grooves 110 on the surface of a sapphire substrate. Instead of using the above-described wet etching, a dry etching can be used. For the exposure step, a holography technique utilizing laser light or electron beam interference can be used.

According to the present example, the side walls of the grooves 100 constitute the {1-100} cleavage plane (M plane). As will be appreciated, a cleavage plane is a plane of a given crystal structure which is likely to be revealed as a result of physical processing. Alternatively, other cleavage planes may also be used. For example, for a substrate of a hexagonal system material (including sapphire substrates), the {1-100} plane (M plane) or the {01-20} plane (R plane) constitutes a cleavage plane. For a substrate of a zincblende or diamond structured material, the {110} plane constitutes a cleavage plane. Grooves 110 can be formed so that their side walls extend along such plane orientations.

The {1-100} plane of a sapphire substrate is also a plane which is likely to be revealed as a result of a chemical etching (hereinafter referred to as an "etching stable plane"). The grooves 110 can be formed in accordance with such an etching stable plane, whereby similarly steep side walls of the grooves 110 can be obtained. For a substrate of a hexagonal system material (including sapphire substrates), the {1-100} plane (M plane), the {11-20} plane (A plane), the {0001} plane (C plane), or the {01-12} plane (R plane) constitutes an etching stable plane. For a substrate of a cubic system material, in particular zincblende or diamond structured materials, the {111} plane or the {001} plane constitutes an etching stable plane. Grooves 110 can be formed so that their side walls extend along such plane orientations.

Next, a process for producing a nitride semiconductor structure by growing a n-GaN film on a processed substrate 100 by using a MOCVD apparatus will be described.

The processed substrate 100 as shown in FIG. 1 (or FIG. 2A) was washed well in an organic solvent, and set in a MOCVD apparatus. Before growing the n-GaN film 121, the processed substrate 100 was subjected to a thermal cleaning for about 10 minutes in a $H_2$ gas flow at a temperature of about 1025° C. Then, the substrate temperature was lowered to about 550° C., and TMG (trimethyl gallium) was supplied as a III group material at a rate of about 10 cc/min, and $NH_3$ was supplied as a V group material at a rate of about 5000 cc/min, thereby growing a GaN buffer layer 120 having a thickness of about 20 nm. This method is similar to known methods for performing epitaxial growth on a sapphire substrate.

Next, the substrate was heated to a temperature of about 1000° C. TMG was supplied at a rate of about 50 cc/min, and $NH_3$ was supplied at a rate of about 5000 cc/min. Furthermore, $SiH_4$ (silane) was supplied as a donor impurity, thereby growing the n-GaN film 121 having a thickness of about 9 μm.

As the thickness of the n-GaN film 121 exceeded about 3 μm, the grooves 110 on the substrate surface began to be covered, and therefore flattened, by the n-GaN film 121 while leaving cavities 116 therein. With continued growth, a threading dislocation density of about $10^7$ cm$^{-2}$ was obtained as the thickness of the n-GaN film 121 reached about 9 μm.

A GaN semiconductor which is epitaxially grown on the C plane of a sapphire substrate is known to be of the following epitaxial relationship: $(0001)_{sapphire}//(0001)_{GaN}$ and $[1-210]_{sapphire}//[-1010]_{GaN}$. Consequently, forming the grooves 110 along the [11-20] direction of a sapphire substrate is equivalent to forming the grooves 110 along the [1-100] direction of GaN. Thus, the grooves 110 according to the present example are formed along the cleavage direction of the substrate as well as along the <1-100>  direction of the nitride semiconductor which is grown directly on the substrate.

Since the nitride semiconductor (GaN) laterally grows along the <11-20> direction of the nitride semiconductor (GaN) in the C plane of the sapphire substrate, the grooves 110 according to the present invention are formed along a cleavage direction of the substrate as well as along a direction perpendicular to the rapid lateral growth direction of the nitride semiconductor growing on the substrate. Since the grooves 110 are formed along a cleavage direction of the substrate, it is easy to process the grooves 110 so that steep side walls of grooves 110 can be provided, whereby a substantial level difference with the adjoining convex portions 114 can be realized. Since the grooves 110 are formed along a direction perpendicular to the rapid lateral growth direction of the nitride semiconductor growing on the substrate, it is easy to form the cavities 116. As a result, the crystal quality of the resultant nitride semiconductor film 121 can be enhanced despite stress-induced strain, and cracks in the nitride semiconductor film 121 can be prevented.

By ensuring that the grooves 110 on the processed substrate 100 have a depth h and a width b such that $h \geq 0.2 \times b$, it is possible to relax the stress-induced strain in the nitride semiconductor film 121 due to any lattice mismatching and/or difference in thermal expansion coefficient between the n-GaN film 121 and the processed substrate 100. The stress reduction makes it possible to minimize cracks that may be generated when forming a thick nitride semiconductor film. If the groove width b is so large, or if the groove depth h is so small that the condition $h \geq 0.2 \times b$ is not satisfied, cavities will not be formed in the grooves 110 because the interior of the grooves 110 will be filled with the nitride semiconductor film in the initial stage of growth. As a result, the effects of lateral growth or strain relaxation cannot be attained. If the groove pitch is increased, the resultant nitride semiconductor film will have a threading dislocation density which is substantially the same as that of a nitride semiconductor film which is formed on a conventional flat sapphire substrate, as described earlier.

A surface TEM (transmission electron microscopy) was performed in order to evaluate the density of threading dislocations appearing on the surface of the n-GaN film 121 shown in FIG. 1. The results indicated that the threading dislocation density on the surface of the grown film had been reduced to about $10^7$ cm$^{-2}$, which is substantially the same as, or not significantly higher than, the threading dislocation density levels reported for any conventional technique.

Under the prior art, the masking pattern used for the selective growth is likely to be thermally damaged during the second growth stage of a nitride semiconductor, so that the component elements of the masking pattern may serve as impurities that affect the grown nitride semiconductor film. On the contrary, the thin growth film layer produced according to the present invention does not contain any component elements to serve as such impurities. The inventors conducted a photoluminescence (PL) measurement of the grown nitride semiconductor film to calculate an intensity ratio between the peak intensity of the near band edge associated with the grown nitride semiconductor film (a single GaN film) and the intensity from a deep band level due to impurities. As a result, it was indicated that the intensity ratio obtained according to the present example had been improved by one order of magnitude or more than the intensity ratio obtained by a conventional technique employing a masking pattern. This indicates the excellent quality of the nitride semiconductor film grown according to the present example.

Although the grooves 110 on the processed substrate 100 illustrated above had a pitch L of about 12 μm, the pitch L can be further reduced for a higher groove density, thereby minimizing the threading dislocation density. Although the grooves 110 illustrated above had a width b of about 6 μm, it is also possible to employ a smaller groove width. Although the groove pitch according to the present example is illustrated as constant, the groove pitch does not need to be constant as long as the intervals between grooves is maintained at about 20 μm or less.

Thus, according to the present example, it is possible to epitaxially grow a high-quality nitride semiconductor film on a substrate having a different lattice constant or a different thermal expansion coefficient from that of the nitride semiconductor, without employing a complicated two-phase growth technique.

EXAMPLE 2

Example 2 is a modification of Example 1, where the same configuration as that of Example 1 is employed except that a different groove pattern is formed on the sapphire substrate. FIGS. 3A and 3B illustrate a processed substrate 100 formed according to Example 2 of the present invention.

The processed substrate 100 according to the present example is obtained by forming grooves 111 on the C plane of the sapphire substrate so as to extend along the [11-20] direction and the [-2110] direction of the sapphire substrate, with a n-GaN film being grown directly on the processed substrate 100 so as to have a thickness of about 8 μm. Hereinafter, the processed substrate 100 and the n-GaN film grown thereon according to the present example will be described.

The C plane of a sapphire substrate was used as a growth surface for allowing crystal growth thereon. The processed substrate 100 shown in FIGS. 3A and 3B was produced by using a FIB technique. The grooves 111 formed on the sapphire substrate surface had a width b of about 1 μm, a depth h of about 3 μm, and a groove pitch L of about 3 μm. The grooves 111 were formed so as to extend along the [11-20] direction or the [-2110] direction of the sapphire substrate.

Next, a n-GaN film was grown on the processed substrate 100 by using a MOCVD apparatus as follows. First, the processed substrate 100 as shown in FIG. 3A was washed well in an organic solvent, and set in a MOCVD apparatus. Before growing a n-GaN film, the processed substrate 100 was subjected to a thermal cleaning for about 10 minutes in a $H_2$ gas flow at a temperature of about 1025° C. Then, the substrate temperature was lowered to about 500° C., and TMA (trimethyl aluminum) was supplied as a III group material at a rate of about 20 cc/min, and $NH_3$ was supplied as a V group material at a rate of about 5000 cc/min, thereby growing an AlN buffer layer having a thickness of about 50 nm. This method is similar to known methods for performing epitaxial growth on a sapphire substrate.

Next, the substrate was heated to a temperature of about 1000° C. TMG was supplied at a rate of about 50 cc/min, and $NH_3$ was supplied at a rate of about 5000 cc/min. Furthermore, $SiH_4$ (silane) was supplied as a donor impurity, thereby growing a n-GaN film having a thickness of about 8 μm.

Like in Example 1, as the thickness of the n-GaN film exceeded about 2 μm, the grooves 111 on the substrate surface began to be covered, and therefore flattened, by the n-GaN film while leaving cavities therein. With continued growth, a threading dislocation density of about $10^5$ cm$^{-2}$ to about $10^6$ cm$^{-2}$ was obtained as the thickness of the n-GaN film reached about 8 μm. As in Example 1, the PL intensity of the near band edge associated with the grown nitride semiconductor film proved very intense, whereas the intensity from a deep band level due to impurities was extremely small. Thus, a high-quality single GaN film was formed as in Example 1.

The relative depth of the grooves 111 according to the present example is larger than that of the grooves 110 in Example 1. By employing a groove depth which is larger than the groove width, the supply of source gas into the grooves 111 during the vapor deposition step becomes extremely scarce, so that virtually no crystal growth occurs within the grooves 111.

According to the present example, the grooves 111 are formed along a plurality of directions. The grooves 111 extending along the <11-20> of the sapphire substrate can take any of three directions in the C plane of the sapphire substrate, i.e., [11-20], [-2110], and [1-210]. When a nitride semiconductor is grown in a C axis alignment with respect to a sapphire substrate as in the present example, three directions also exist in the C plane of the nitride semiconductor. The grooves 111 on the processed substrate 100 according to the present example were formed along two selected ones of these three directions. As a result, the GaN which had been grown on the processed substrate 100 underwent an enhanced lateral growth along directions which are respectively perpendicular to the selected two directions. The pitch of the grooves 111 according to the present example is reduced to half of the pitch of the groove 110 for an increased groove density. Accordingly, the threading dislocation density according to the present example was improved by about one order of magnitude than that obtained in Example 1.

Thus, according to the present example, it is possible to epitaxially grow a high-quality nitride semiconductor film on a substrate having a different lattice constant or a different thermal expansion coefficient from that of the nitride semiconductor, without employing a complicated two-phase growth technique.

EXAMPLE 3

Example 3 is a modification of Example 2, where the same configuration as that of Example 2 is employed except that a different groove pattern is formed on the sapphire substrate. In the present example, grooves 112 are formed along all of the three directions that equivalently correspond to the <11-20> direction of the sapphire substrate as described in Example 2. Accordingly, all of the three <1-100> directions of the nitride semiconductor are selected, too.

FIG. 4 illustrates a processed substrate 100 formed according to Example 3 of the present invention.

The processed substrate 100 according to the present example is obtained by forming grooves 112 on the C plane of the sapphire substrate so as to extend along the [11-20] direction, the [-2110] direction, and the [1-210] direction of the sapphire substrate, with a n-GaN film being grown on the processed substrate 100 so as to have a thickness of about 8 μm. Hereinafter, the processed substrate 100 produced according to the present example will be described.

The C plane of a sapphire substrate was used as a growth surface for allowing crystal growth thereon. The processed substrate 100 shown in FIG. 4 was produced by using a FIB technique as in Example 2. The grooves 112 formed on the sapphire substrate surface had a width b of about 1 μm, a depth of about 2 μm, and a groove pitch L of about 4 μm. The grooves 112 were formed so as to extend along the [11-20] direction, the [−2110] direction, or the [1-210] direction of the sapphire substrate.

According to the present example, the GaN which had been grown on the processed substrate 100 underwent a lateral growth along directions which are respectively perpendicular to all of the three directions. Since the depth of the grooves 112 is larger than the width of the grooves 112, as in Example 2, the nitride semiconductor structure of the present example is substantially immune to the stress-induced strain due to the lattice mismatching and/or difference in thermal expansion coefficient between the substrate and the nitride semiconductor film.

The threading dislocation density and PL luminescence results according to the present example were substantially the same as those obtained in Example 2. Thus, a high-quality single GaN film was formed as in Example 2, while similarly suppressing crack generation.

Thus, according to the present example, it is possible to epitaxially grow a high-quality nitride semiconductor film on a substrate having a different lattice constant or a different thermal expansion coefficient from that of the nitride semiconductor, without employing a complicated two-phase growth technique.

EXAMPLE 4

Example 4 is a modification of Example 1 or 2, where the same configuration as that of Example 1 or 2 is employed except that the M plane of a sapphire substrate is employed instead of the C plane, and that certain groove directions are chosen. Hereinafter, a processed substrate produced according to the present example will be described.

A GaN semiconductor which is epitaxially grown on the M plane of a sapphire substrate is of the following epitaxial relationship: $(01\text{-}10)_{sapphire}//(01\text{-}13)_{GaN}$ and $[0001]_{sapphire}//[2\text{-}1\text{-}10]_{GaN}$. Consequently, forming a groove whose {1-100} plane extends along the [0001] direction of the M plane of the sapphire substrate is equivalent to forming the groove along the M plane ({1-100}), which is a cleavage plane of the sapphire substrate. Similarly, forming a groove whose {1-100} plane extends along the [2-1-10] direction of the M plane of the sapphire substrate is equivalent to forming the groove along a direction perpendicular to the direction of lateral growth of the GaN which is grown on the M plane of the sapphire substrate. Grooves are formed on the M plane of the sapphire substrate along at least one of these two directions, thereby producing a processed substrate.

Where the grooves are formed along only one of the above two directions, the present example constitutes a modification of Example 1. Where the grooves are formed along both directions, the present example constitutes a modification of Example 2.

Processed substrates were produced with grooves having a width b of about 2 μm, a depth h of about 3 μm, and a groove pitch L of about 5 μm, and a nitride semiconductor film was formed so as to have a thickness of about 10 μm. Furthermore, two subspecies of the processed substrate were formed so as to include grooves extending along either one direction or both directions. Both subspecies exhibited a threading dislocation density of about $10^6$ cm$^{-2}$ to about $10^7$ cm$^{-2}$. This threading dislocation density range was about the same as that reported for any conventional technique utilizing a masking pattern. According to the present example, the direction of the cleavage plane of the processed substrate does not coincide with a direction perpendicular to the direction of lateral growth of the nitride semiconductor, which is considered as responsible for the threading dislocation density which is one order of magnitude higher than that obtained in Example 2 or 3.

As in Example 1, the PL intensity of the near band edge associated with the grown nitride semiconductor film was very intense, whereas the intensity from a deep band level due to impurities was extremely small. Crack generation was similarly suppressed, too.

Thus, according to the present example, it is possible to epitaxially grow a high-quality nitride semiconductor film on a substrate having a different lattice constant or a different thermal expansion coefficient from that of the nitride semiconductor, without employing a complicated two-phase growth technique.

EXAMPLE 5

Example 5 is a modification of Examples 1 to 3, where the same configuration as that of Examples 1 to 3 is employed except that the A plane of a sapphire substrate is employed instead of the C plane. Hereinafter, a processed substrate produced according to the present example will be described.

A GaN semiconductor which is epitaxially grown on the C plane of a sapphire substrate is of the either one of the following two epitaxial relationships (i) or (ii), depending on the crystal growth conditions of the nitride semiconductor:

(i) $(2\text{-}1\text{-}10)_{sapphire}//(0001)_{GaN}$, $[0001]_{sapphire}//[2\text{-}1\text{-}10]_{GaN}$, and $[01\text{-}10]_{sapphire}//[01\text{-}10]_{GaN}$; or (ii) $(2\text{-}1\text{-}10)_{sapphire}//(0001)_{GaN}$, $[0001]_{sapphire}//[01\text{-}10]_{GaN}$, and $[01\text{-}10]_{sapphire}//[2\text{-}1\text{-}10]_{GaN}$.

Under epitaxial relationship (i), grooves are formed along the [0001] direction, a direction at an angle of 32.4° with respect to the [0001] direction, or the [01-10] direction. Grooves which are formed along the first two directions have side walls corresponding respectively to the M plane (the {1-100} plane) and the R plane (the {01-12} plane), both of which are cleavage faces of a sapphire substrate. The third direction is perpendicular to the lateral growth of GaN which is grown on the A plane of a sapphire substrate. Grooves are formed on the A plane of a sapphire substrate so as to extend along each one of these directions, or any combination thereof, thereby forming a processed substrate.

Where the grooves are formed along only one of the above three directions, the present example constitutes a modification of Example 1. Where the grooves are formed along any combination of these directions, the present example constitutes a modification of Example 2 or 3. The same effects as in Example 4 are attained in the present example (epitaxial relationship (i)), while similarly suppressing crack generation, by utilizing epitaxial relationship (i) and the A plane of a sapphire substrate.

Under epitaxial relationship (ii), grooves are formed along the [0001] direction, or a direction at an angle of 32.4° with respect to the [0001] direction. Grooves which are formed along the former direction have side walls corresponding to the M plane (the {1-100} plane), which is a cleavage face of a sapphire substrate, and this direction is perpendicular to the lateral growth of GaN which is grown on the A plane of the sapphire substrate. Accordingly, the same effects as in Example 1 (which utilized the C plane of the sapphire substrate) are obtained according to the present example (epitaxial relationship (ii)). On the other hand, grooves which are formed along the latter direction have side walls corresponding to the R plane (the {01-12} plane), which is a cleavage plane of a sapphire substrate. Grooves are formed on the A plane of a sapphire substrate so as to extend along either one, or both, of these directions.

Where the grooves are formed along only one direction, the present example constitutes a modification of Example 1 as shown in FIGS. 2A and 2B. Where the grooves are formed along both directions, the present example constitutes a modification of Example 2 or 3. The same effects as in Example 1 are attained in the present example, while similarly suppressing crack generation, by utilizing epitaxial relationship (ii) and the A plane of a sapphire substrate.

Thus, according to the present example, it is possible to epitaxially grow a high-quality nitride semiconductor film on a substrate having a different lattice constant or a different thermal expansion coefficient from that of the nitride semiconductor, without employing a complicated two-phase growth technique.

EXAMPLE 6

Example 6 is a modification of Example 1, where the same configuration as that of Example 1 is employed except that the R plane of a sapphire substrate is employed instead of the C plane. Hereinafter, a processed substrate produced according to the present example will be described.

A GaN semiconductor and the R plane of a sapphire substrate are of the following epitaxial relationship: $(001-2)_{sapphire}//(2-1-10)_{GaN}$ and $[2-1-10]_{sapphire}//[01-10]_{GaN}$. Consequently, forming a groove whose $\{1-100\}$ plane extends along the [2-1-10] direction of the R plane of the sapphire substrate is equivalent to forming the groove along the M plane ($\{1-100\}$), which is a cleavage plane of the sapphire substrate. Grooves are formed on the R plane of the sapphire substrate along this direction, thereby producing a processed substrate. The threading dislocation density obtained according to the present example is about $10^7$ cm$^{-2}$ to about $10^8$ cm$^{-2}$, which is substantially the same as, or not significantly higher than, the threading dislocation density levels reported for any conventional technique using a masking pattern. However, the PL intensity of the deep band level due to impurities was similar to that obtained in Example 1. Crack generation was similarly suppressed, too.

Thus, according to the present example, it is possible to epitaxially grow a high-quality nitride semiconductor film on a substrate having a different lattice constant or a different thermal expansion coefficient from that of the nitride semiconductor, without employing a complicated two-phase growth technique.

EXAMPLE 7

Example 7 is a modification of Example 1 to 3, where the same configuration as that of Example 1 to 3 is employed except that the (0001) plane of a 6H—SiC substrate is employed instead of the C plane of a sapphire substrate. Hereinafter, a processed substrate produced according to the present example will be described.

In the case where a GaN semiconductor which is epitaxially grown on the (0001) plane of a 6H—SiC substrate, the GaN semiconductor and the (0001) plane of the 6H—SiC substrate are of the following epitaxial relationship: $(0001)_{6H-SiC}//(0001)_{GaN}$, and $[01-10]_{6H-SiC}//[01-10]_{GaN}$.

Accordingly, grooves are formed along the [2-1-10] direction or the [01-10] direction of the (0001) plane of the 6H—SiC substrate. Grooves which are formed along the former direction have side walls corresponding to the $\{1-100\}$ plane, which is a cleavage plane of a (0001) plane 6H—SiC substrate. The latter direction is perpendicular to the lateral growth of GaN which is grown on the (0001) plane of the 6H—SiC substrate. Grooves are formed on the (0001) plane of the 6H—SiC substrate so as to extend along either one, or both, of these directions, thereby forming a processed substrate.

Where the grooves are formed along only one direction, the present example constitutes a modification of Example 1. Where the grooves are formed along both directions, the present example constitutes a modification of Example 2 or 3. The same effects as in Example 4 are attained in accordance with the processed substrate of the present example.

Thus, according to the present example, it is possible to epitaxially grow a high-quality nitride semiconductor film on a substrate having a different lattice constant or a different thermal expansion coefficient from that of the nitride semiconductor, without employing a complicated two-phase growth technique.

EXAMPLE 8

Example 8 is a modification of Examples 1 to 3, where the same configuration as that of Examples 1 to 3 is employed except that the (111) plane of a $MgAl_2O_4$ (magnesia spinel) substrate is employed instead of the C plane of a sapphire substrate. Hereinafter, a processed substrate produced according to the present example will be described.

In the case where a GaN semiconductor which is epitaxially grown on the (111) plane of a $MgAl_2O_4$ substrate, the GaN semiconductor and the (111) plane of the $MgAl_2O_4$ substrate are of the following epitaxial relationship: $(111)_{MgAl2O4}//(0001)_{GaN}$, $[-110]_{MgAl2O4}//[2-1-10]_{GaN}$, and $[11-2]_{MgAl2O4}//[01-10]_{GaN}$.

Accordingly, with regard to the (111) plane of the $MgAl_2O_4$ substrate, grooves whose $\{100\}$ plane extends along the [−110] direction or grooves which extend along the [11-2] direction are formed. Grooves which are formed along the former direction have side walls corresponding to the $\{100\}$ plane, which is a cleavage plane of a (111) plane $MgAl_2O_4$ substrate. The latter direction is perpendicular to the lateral growth of GaN which is grown on the (111) plane of the $MgAl_2O_4$ substrate. Grooves are formed on the (111) plane of the $MgAl_2O_4$ substrate so as to extend along either one, or both, of these directions, thereby forming a processed substrate.

Where the grooves are formed along only one direction, the present example constitutes a modification of Example 1. Where the grooves are formed along both directions, the present example constitutes a modification of Example 2 or 3. The same effects as in Example 4 are attained in accordance with of the processed substrate of the present example.

Thus, according to the present example, it is possible to epitaxially grow a high-quality nitride semiconductor film on a substrate having a different lattice constant or a different thermal expansion coefficient from that of the nitride semiconductor, without employing a complicated two-phase growth technique.

EXAMPLE 9

Figure 5A:
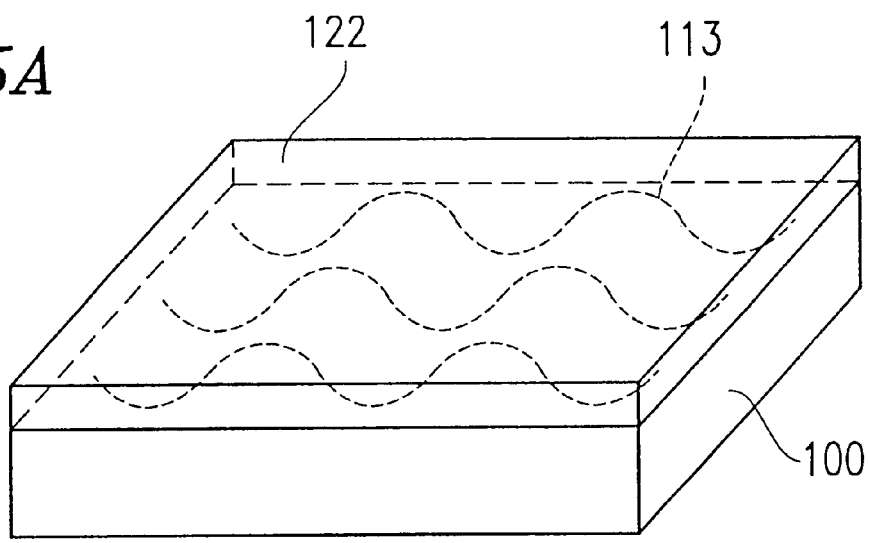
FIGS. 5A and 5B are perspective views illustrating a processed substrate and a nitride semiconductor according to Example 9 of the present invention.
Figure 5B:
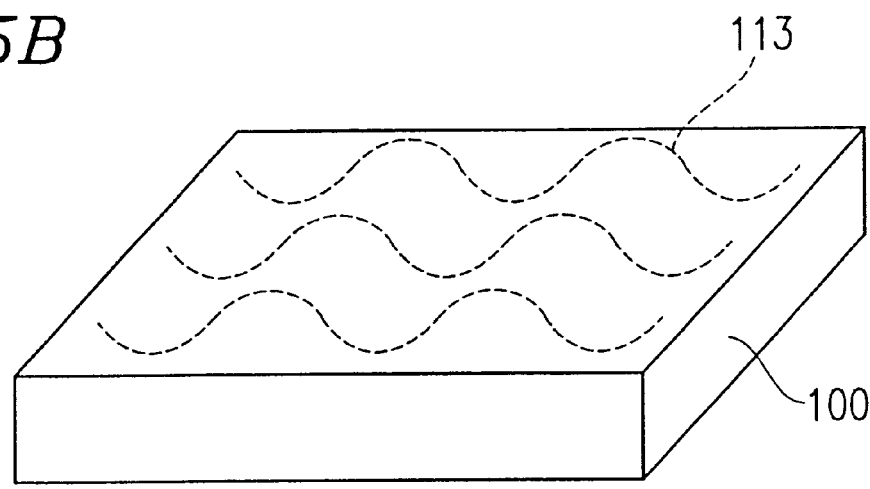

FIG. 5A is a perspective view illustrating a GaN film which has been produced according to the present example. FIG. 5B is a perspective view illustrating a substrate for growing thereon a GaN film according to the present example. The nitride semiconductor structure according to the present example includes a processed substrate 100, which is obtained by forming random convex/concave portions 113 on the C plane of a sapphire substrate. A GaN layer 122 is formed on the processed substrate 100 so as to have a thickness of about 30 μm. Hereinafter, the processed substrate 100 according to the present example, as well as a method for growing a thick GaN film thereon by using a HVPE method, will be described.

The C plane of a sapphire substrate was used as a growth surface for allowing crystal growth thereon. The processed substrate 100 shown in FIG. 5B is obtained by forming random convex/concave portions 113 on a sapphire substrate by using an Ar+ ion milling method. The convex/concave portions 113 had an average level difference of about 3 μm (as determined by surface roughness measurement), and had an average undulation pitch (analogous to a wavelength of the undulations) of about 13 μm.

Next, the n-GaN film 122 was grown on the processed substrate 100 having the convex/concave portions 113 formed thereon in the aforementioned step. First, the processed substrate 100 was washed well in an organic solvent, and set in a HVPE apparatus. Before growing the n-GaN film 122, the processed substrate 100 was subjected to a thermal cleaning for about 10 minutes in a $H_2$ gas flow at a temperature of about 1025° C. A gas obtained by mixing $NH_3$ gas (at a rate of about 2000 cc/min) and a carrier $H_2$ gas (at a rate of about 10000 cc/min) was used as a V group gas. As a III group gas, a gas obtained by mixing a carrier $H_2$ gas (at a rate of about 1000 cc/min) with a III group chloride which had been obtained as an Ga—HCl reaction product by feeding HCl gas (at a rate of about 100 cc/min) to a Ga metal material which had previously been maintained in a HVPE apparatus at about 700° C. was used. In order to begin crystal growth of the GaN film 122, the V group gas and the III group gas were supplied in a HVPE growth reactor in which the processed substrate 100 had been set. As a result, the GaN film 122 as shown in FIG. 5A was formed so as to have a thickness of about 30 μm.

As the thickness of the GaN film 122 exceeded about 5 μm, the convex/concave portions 113 on the surface of the processed substrate 100 began to be covered, and therefore flattened, by the GaN film 122 while leaving cavities therein. With continued growth, a threading dislocation density of about $10^8$ cm$^{-2}$ was obtained as the thickness of the GaN film 122 reached about 30 μm. An observation of the substrate surface by means of an optical microscope revealed no cracks. The threading dislocation density within the GaN film obtained according to the present example is substantially the same as the threading dislocation density levels reported for any conventional technique that does not use a masking pattern. However, the GaN film grown on the processed substrate 100 according to the present example had virtually no cracks generated on the surface of the film in the initial growth stage, as opposed to that obtained by any conventional technique for growing a thick film directly on a sapphire substrate. Thus, the grown thick film with a smaller thickness obtained the same threading dislocation density.

Although Examples 1 to 9 above illustrated GaN as a nitride semiconductor to be grown in the structure, it is also applicable to employ other nitride semiconductors, e.g., $Al_xGa_yIn_{1-x-y}N$ (where $0 \leq x \leq 1$ and $0 \leq y \leq 1$), or any material obtained by substituting any one of the elements of $Al_xGa_yIn_{1-x-y}N$ (where $0 \leq x \leq 1$ and $0 \leq y \leq 1$), with an element selected from B, Cr, V, Ti, Nb, Ta, Zr, Sc, Tl, Gd, La, As, P, Sb, etc., as long as the substituted element accounts for about 10% or less of the entire material.

Thus, according to the present example, it is possible to epitaxially grow a high-quality nitride semiconductor film on a substrate having a different lattice constant or a different thermal expansion coefficient from that of the nitride semiconductor, without employing a complicated two-phase growth technique.

EXAMPLE 10

Figure 6:
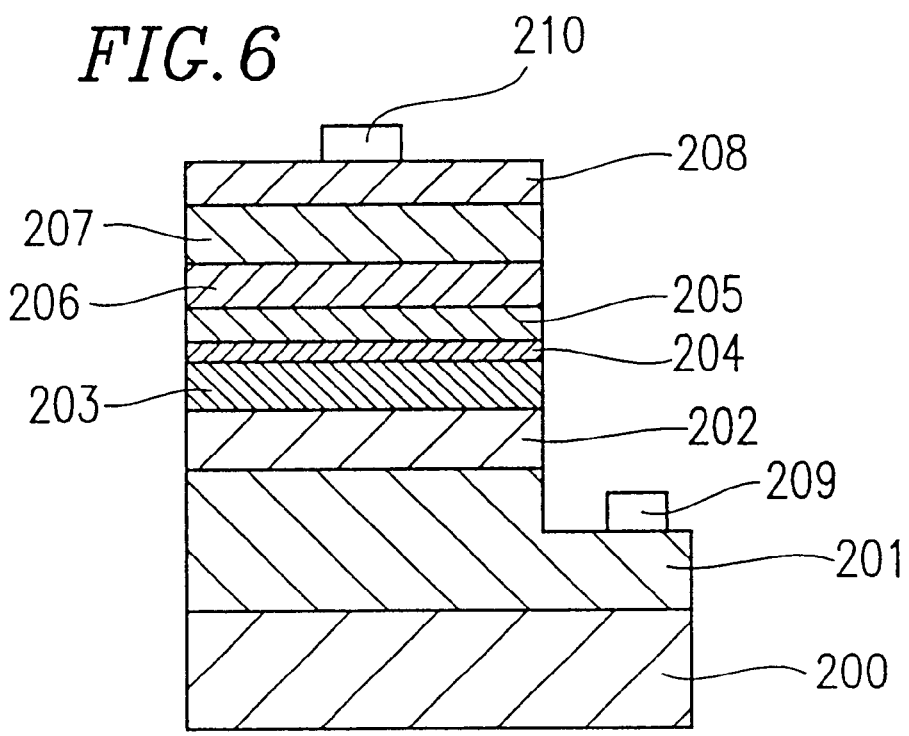
FIG. 6 is a cross-sectional view illustrating a laser diode device structure according to Example 10 of the present invention.

FIG. 6 illustrates an exemplary LD device structure produced according to Example 10 of the present invention. The present example illustrates a LD device. structure which, as a light emitting device, is formed directly on a processed substrate 200 (having a n-GaN film formed thereon) produced according to Example 2.

Hereinafter, a method for producing the semiconductor light emitting device according to the present example will be described.

First, a nitride semiconductor structure (which is herein defined as including both a processed substrate and a n-GaN film grown thereon) 200 was placed in a MOCVD apparatus, and subjected to a thermal cleaning at about 1050° C. Then, among various material gases which the MOCVD apparatus was equipped with, $NH_3$ gas was used as a V group material gas; TMG (trimethyl gallium) gas was used as a III group material; and $SiH_4$ (silane) gas was used as a donor impurity, in order to grow a Si-doped n-GaN layer 201 on the nitride semiconductor structure so as to have a thickness of about 3 μm at a growth temperature of about 1000° C.

Next, in order to form a second layer (cladding layer), $NH_3$, TMG and TMA gases were used as material gases, and $SiH_4$ gas was used as a donor impurity, thereby growing a Si-doped $Al_{0.1}Ga_{0.9}N$ layer 202 so as to have a thickness of about 0.4 pm.

Next, in order to form a third layer (optical guide layer), $NH_3$ and TMG gases were used as material gases, and SiH4 gas was used as a donor impurity, thereby growing a Si-doped GaN layer 203 so as to have a thickness of about 0.1 μm.

In order to form a fourth layer (multiple quantum well layer), $NH_3$, TMG and TMI (trimethyl indium) gases were used as material gases, and $SiH_4$ gas was used as a donor impurity, thereby creating a five-fold Si-doped n-multiple quantum well layer 204, where each cycle consisted of an $In_{0.2}Ga_{0.8}N$ (thickness: about 2 nm) and an $In_{0.05}Ga_{0.95}N$ (thickness: about 3 nm). Furthermore, a p-$Al_{0.2}Ga_{0.8}N$ evaporation prevention layer 205 (thickness: about 30 nm) was grown in order to prevent evaporation of In in the quantum well active layer 204 during growth of the nitride semiconductor layer immediately above the active layer.

Next, in order to form a fifth layer (optical guide layer), $NH_3$ and TMG gases were used as material gases, and $EtCp_2Mg$ (bisethylcyclopentadienylmagnesium) gas was used as an acceptor impurity, thereby growing a Mg-doped p-GaN layer 206 so as to have a thickness of about 0.1 μm.

Next, in order to form a sixth layer (cladding layer), $NH_3$, TMG, and TMA gases were used as material gases, and $EtCp_2Mg$ gas was used as an acceptor impurity, thereby growing a Mg-doped p-$Al_{0.1}Ga_{0.9}N$ layer 207 so as to have a thickness of about 0.4 μm.

Lastly, in order to form a seventh layer (contact layer), $NH_3$, TMG, and TMA gases were used as material gases, and $EtCp_2Mg$ gas was used as an acceptor impurity, thereby growing a Mg-doped p-GaN layer 208 so as to have a thickness of about 0.5 μm.

Furthermore, a positive electrode 210, and a negative electrode 209 were formed on the Mg-doped pGaN layer 208 and the Si-doped GaN layer 201, respectively, thereby accomplishing the LD device. As for the method of laminating the n layers and the p layers of this LD device structure, it is also applicable to form the p layers first, and then form the active layer and the n layers.

Although the processed substrate 200 of the above-described LD device incorporates a n-GaN film having a flat surface as produced according to Example 2, it will be appreciated that a GaN film produced according to Example 1 or any of Examples 3 to 9 may alternatively be adopted. Furthermore, the GaN film formation according to any of Examples 1 to 9 and the LD device production according to the present example may be consecutively performed in the same apparatus. Alternatively, it is also possible to employ the GaN film obtained according to the respective Examples by itself, i.e., after removing the processed substrate.

A high temperature acceleration test using a 2 mW optical output power was conducted for the LD device produced according to Example 10 in an atmosphere at about 50° C., as a result of which the inventors confirmed that the LD device had a continuous operation lifetime of about 8000 hours (as converted into use under room temperature). This continuous operation lifetime provides more than about 20% improvement over that of a LD device produced by a conventional method which was similarly subjected to a high temperature acceleration test. Such high reliability of the LD device according to the present invention owes to the decrease in threading dislocation density and the elimination of unwanted impurities according to the present example.

EXAMPLE 11

Figure 7:
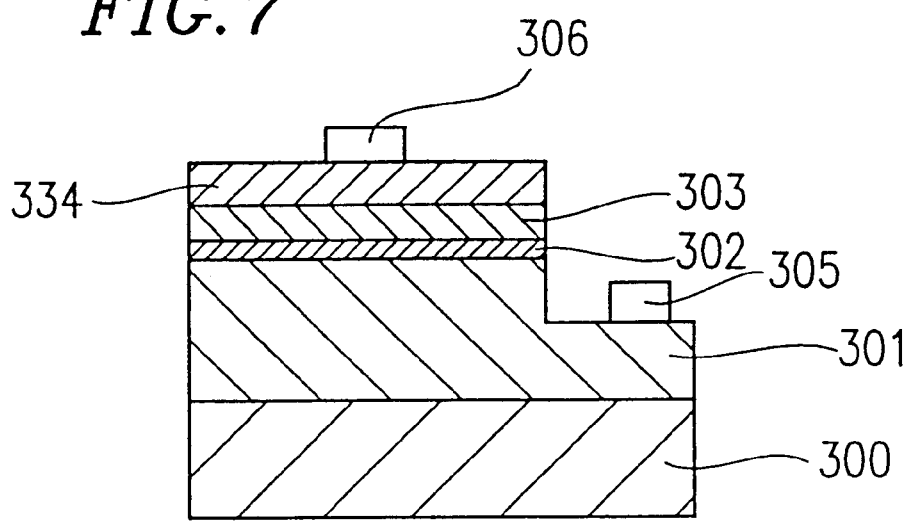
FIG. 7 is a cross-sectional view illustrating a light emitting diode device structure according to Example 11 of the present invention.

FIG. 7 illustrates an exemplary structure of a LED device produced according to Example 11 of the present invention. The present example illustrates a LED device structure which is constructed on a nitride semiconductor structure according to Example 1 by using a MBE apparatus.

A processed substrate 300 with a n-GaN film grown thereon, as produced according to Example 1, was placed in a MBE apparatus. A n-GaN first layer 301 was formed so as to have a thickness of about 2 μm. Then, an $In_{0.45}Ga_{0.55}N$ second layer (single quantum well layer) 302 was formed so as to have a thickness of about 4 nm. Furthermore, a p-$Al_{0.1}Ga_{0.9}N$ evaporation prevention layer 303 (thickness: about 100 nm) was grown in order to prevent evaporation of In in the quantum well active layer 302 during growth of the nitride semiconductor layer immediately above the active layer. Lastly, a p-GaN third layer (contact layer) 304 was formed so as to have a thickness of about 0.4 μm.

Furthermore, a positive electrode 306, and a negative electrode 305 were formed on the Mg-doped p-GaN third layer (contact layer) 304 and the n-GaN first layer 301, respectively, thereby accomplishing the LED device.

The electron-photon conversion efficiency of the LED device products produced according to the present example was measured. As a result, it was confirmed that products having an electron-photon conversion efficiency of about 5% or higher (which is considered as a satisfactory level) accounted for about 88% or more of the entire wafer, indicative of about 13% improvement in the LED device production yield from conventional techniques. Furthermore, the LED device of the present invention was subjected to a reliability test after 1000 hours of operation, which exhibited luminescence of about 97% or more of the level attained at the beginning of the test. Thus, it was also confirmed that the LED device has practical reliability. Such high reliability of the LED device according to the present invention owes to the decrease in threading dislocation density, the elimination of unwanted impurities, and the prevention of cracks according to the present example.

Although the processed substrate 300 of the above-described LED device incorporates a n-GaN film as produced according to Example 1, it will be appreciated that a GaN film produced according to any of Examples 2 to 9 may alternatively be adopted. Furthermore, the GaN film formation according to any of Examples 1 to 9 and the LED device production according to the present example may be consecutively performed in the same apparatus. Alternatively, it is also possible to employ the GaN film obtained according to the respective Examples by itself, i.e., after removing the processed substrate.

EXAMPLE 12

Figure 9A:
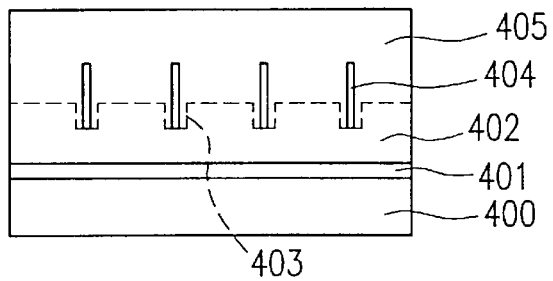
FIGS. 9A, 9C, 9D, and 9E are cross-sectional views.

FIG. 9A is a cross-sectional view illustrating the structure of a GaN film 405 which is produced according to Example 12 of the present invention. The broken line in FIG. 9A corresponds to the shape of grooves 403 in FIG. 9C. The device according to the present example includes a GaN buffer layer 401, a GaN layer 402, and a GaN film 405 grown on a sapphire substrate 400. The grooves 403 are formed on the GaN layer 402. Cavities 404 are formed so as to correspond to the grooves 403.

Figure 9B:
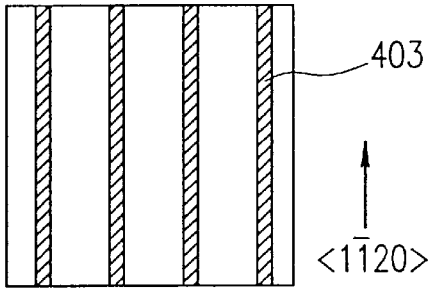
FIG. 9B is a plan view, illustrating a nitride semiconductor structure according to Example 12 of the present invention.
Figure 9C:
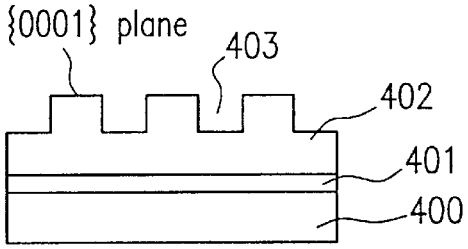

A method for producing the device of the present example will be described. The C plane of a sapphire substrate 400 was used as a growth surface for allowing crystal growth thereon. The sapphire substrate 400 was placed in the reactor of a MOCVD apparatus, and subjected to a thermal cleaning for about 10 minutes in a $H_2$ atmosphere flow at a temperature of about 1100° C. Then, TMG was supplied as a III group material and $NH_3$ was supplied as a V group material in the growth reactor, thereby growing the GaN buffer layer 401 having a thickness of about 30 nm at a growth temperature of about 550° C. Instead of a GaN buffer 401, an AlN buffer layer may alternatively be used. These steps are part of well-known techniques for nitride semiconductor crystal growth. After the GaN buffer layer 401 is grown, the substrate temperature is increased to about 1050° C. in order to grow the GaN layer 402 so as to have a thickness of about 3 μm. Next, the substrate on which the GaN layer 402 had been grown (hereinafter referred to as the "sapphire substrate with GaN") is removed from the MOCVD apparatus reactor, and the grooves 403 were formed on the GaN layer 402 so to extend along the <11-20> direction of the GaN crystal by using a FIB method. The side walls of the grooves 403 constitute the {1-100} cleavage plane of the GaN crystal. FIGS. 9B and 9C are a plan view and a cross-sectional view, respectively, illustrating the grooves 403 formed in this step. As shown in FIGS. 9A to 9C, the GaN film is formed on the growth surface of the substrate.

The grooves 403 had a width b of about 5 μm, a depth h of about 2 μm, and a groove pitch L of about 10 μm. The width b and the depth h of the grooves 403 satisfied at least $h \geq 0.2 \times b$.

The GaN film 405 was grown on the GaN layer 402 (having the grooves 403 formed thereon through the above steps) so as to have a thickness of about 200 μm by using a HVPE method. A method for producing the GaN film 405 will be described below.

First, the sapphire substrate with GaN was washed well in an organic solvent, and set in a HVPE apparatus. A gas obtained by mixing $NH_3$ gas (at a rate of about 2000 cc/min) and a carrier $H_2$ gas (at a rate of about 10000 cc/min) was used as a V group gas. As a III group gas, a gas obtained by mixing a carrier $H_2$ gas (at a rate of about 1000 cc/min) with a III group chloride which had been obtained as a Ga—HCl reaction product by feeding HCl gas (at a rate of about 100 cc/min) to a Ga metal material which had previously been maintained in a HVPE apparatus at about 700° C. was used. In order to begin crystal growth of the GaN film 405, the V group gas and the III group gas were supplied in a HVPE growth reactor. As a result, the GaN film 405 was formed so as to have a thickness of about 200 μm. The GaN film 405 was grown to attain a flat configuration, with the grooves 403 completely buried. An observation of the surface of the GaN film 405 by means of an optical microscope revealed no cracks. The threading dislocation density within the GaN film 405 obtained according to the present example was about $10^6$ cm$^{-2}$ to about $10^7$ cm$^{-2}$. Since no masking pattern such as $SiO_2$ was used, as in the above examples, unwanted impurities were prevented from being mixed.

Although the grooves 403 had a rectangular cross section, {1-101} facets were spontaneously formed (FIG. 9D) during the growth of the GaN film 405. This is ascribable to the fact that the {1-101} plane has a slower GaN crystal growth rate than other plane orientations. The reason for forming the grooves 403 along the <11-20> direction according to the present example is to allow the {1-101} plane of the nitride semiconductor crystal (in particular GaN crystal) to be formed as side walls of the grooves 403 because the {1-101} plane has a slower crystal growth rate than the {0001} plane. Alternatively, any direction other than the <11-20> direction can be used so long as it allows the {1-101} plane of the nitride semiconductor crystal to be formed as side walls of the grooves 403.

Alternatively, a {11-2i} (where 0≦i≦3) plane may be used as a facet having a slower crystal growth rate than that the {0001} plane, instead of the aforementioned {1-101} facet. In order to allow a {11-2i} (where 0<i≦3) plane to be formed as side walls of the grooves 403, the grooves can be formed so as to extend along the <1-100> direction on a nitride semiconductor film having the {0001} plane. Any method other than the method of forming the grooves along the <11-20> direction can be used so long as it allows a {11-2i} (where 0≦i≦3) plane to be formed as side walls of the grooves 403.

Figure 9D:
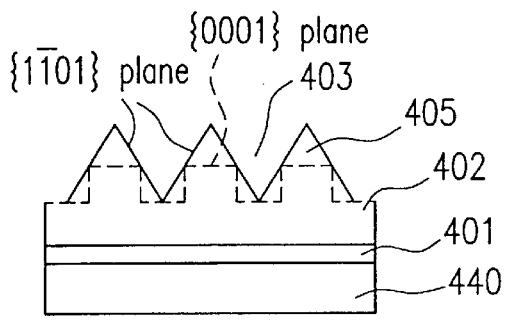

The inventors confirmed the following facts upon observing the process of the grooves 403 being buried in the GaN film 405. At first, the grooves 403 on the GaN layer 402 at first appeared to become deeper with the growth of the GaN film 405 because the crystal growth on the {0001} plane occurs faster than the crystal growth on the {1-101} plane so that the growth was promoted along the growth axis without allowing the grooves 403 to be buried (FIG. 9D). It is presumable that, since GaN has a slower crystal growth rate (i.e., it has a long surface diffusion distance) on the {1-101} plane than on the other planes, any Ga atoms which came onto the {1-101} plane are ejected (before they can be deposited as GaN) to the {0001} plane, where the Ga atoms bind with N atoms to form GaN.

Figure 9E:
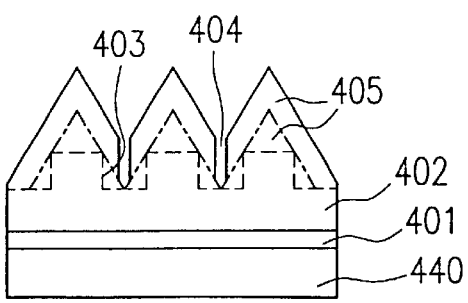

As the crystal growth of the GaN film 405 proceeds, the growth surface on the {0001} plane is reduced until grooves or undulation having a triangular configuration, surrounded by {1-101} facets, are formed as shown by the solid line in FIG. 9D. The broken line in FIG. 9A corresponds to the grooves 403 in FIG. 9C. With further growth of GaN crystal, the GaN crystal begins to grow on the {1-101} facets because the Ga atoms, which has been ejected onto the {0001} plane, cannot go anywhere but remain on the {1-101} facets. This is because the growth on the {0001} plane is along the growth axis, whereas the growth on the {1-101} facets is along a pseudo-lateral direction with respect to the growth axis. The grooves 403 begin to be buried with the growth on the {1-101} facets. However, the grooves 403 have become deeper than when they were initially formed due to the growth along the growth axis which had occurred before the {1-101} facets buried the grooves 403, so that now it is difficult for the material gases to enter into the grooves 403. Moreover, the GaN depositions which have laterally grown from both sides of each groove 403 meet in the middle over the groove 403, but do not completely combine with each other due to a slight difference in crystal orientation, thereby leaving a cavity 404 as shown in FIG. 9E. The broken line and the dot-and-dash line in FIG. 9E respectively correspond to the configurations shown in FIGS. 9C and 9D.

The cavities 404 which have been thus formed provide relaxation of strain as in the above-described examples. The reduced threading dislocation density of the structure according to the present example is not only due to the presence of the cavities 404 but presumably because the threading dislocations are deflected in a lateral direction from the growth axis direction at the {1-101} facets as the cavities 404 are buried through lateral growth, so that fewer threading dislocations reach the outermost surface of the GaN film 405.

If the width b and the depth h of the grooves 403 formed on the nitride semiconductor film satisfy h≧b, the grooves 403 are sufficiently deep to prevent the material gases from reaching the bottoms of the grooves 403, so that cavities are formed even without burying the grooves 403. Therefore, in the case where the grooves 403 are sufficiently deep, the cavities are formed in accordance with Example 2 or 3 rather than with the present example.

Thus, according to the present invention, it is possible to epitaxially grow a high-quality nitride semiconductor film on a substrate having a different lattice constant or a different thermal expansion coefficient from that of the nitride semiconductor, without employing a complicated two-phase growth technique, so that the nitride semiconductor film has a low threading dislocation density, includes substantially no cracks when formed to a large thickness, and are substantially free of unwanted impurities. In addition, a LED or LD having a very high emission efficiency can be produced with a high yield by constructing a light emitting device structure on the high-quality nitride semiconductor film grown by the nitride semiconductor film production method of the present invention.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A light emitting device or a laser device comprising:
    a nitride semiconductor structure including a substrate having a growth surface, a convex portion and a concave portion being formed on the growth surface, and a nitride semiconductor film grown on the growth surface, and
    a light emitting structure formed on the nitride semiconductor structure, the light emitting structure including an active layer comprising a nitride semiconductor, wherein the convex portion and the concave portion of the nitride semiconductor structure comprise a plurality of parallel grooves.

2. A light emitting device or a laser device according to claim 1, wherein the plurality of grooves have a width b and a depth h such that b≦about 10 μm and h≧0.2×b, and wherein adjoining ones of the plurality of grooves are spaced apart from each other so as to retain a distance of about 20 μm or less between center lines thereof.

3. A light emitting device or a laser device according to claim 1, wherein the plurality of grooves have a width b and a depth h such that b≦about 10 μm and h≧b, and wherein adjoining ones of the plurality of grooves are spaced apart from each other so as to retain a distance of about 20 μm or less between center lines thereof.

4. A light emitting device or a laser device according to claim 1, wherein the plurality of grooves are formed along a <1-100> direction of the nitride semiconductor.

5. A light emitting device or a laser device according to claim 1, wherein the plurality of grooves are formed so as to extend along a cleavage plane or an etching stable plane of the substrate.

6. A light emitting device or a laser device according to claim 1, wherein the growth surface of the substrate of the nitride semiconductor structure comprises a nitride semiconductor formed on the substrate, and the plurality of grooves are formed along a <11-20> direction of the substrate semiconductor.

7. A light emitting device or a laser device according to claim 2, wherein the growth surface of the substrate of the nitride semiconductor structure comprises a nitride semiconductor formed on the substrate, and the plurality of grooves are formed along a <11-20> direction of the nitride semiconductor.

8. A light emitting device or a laser device according to claim 3, wherein the growth surface of the substrate of the nitride semiconductor structure comprises a nitride semiconductor formed on the substrate, and the plurality of grooves are formed along a <11-20> direction of the nitride semiconductor.

9. The light emitting device or laser device of claim 1, wherein the nitride semiconductor includes at least one element selected from the group consisting of B, As, P and Sb.

10. A light emitting device or a laser device comprising:

a nitride semiconductor structure including a substrate having a growth surface, a convex portion and a concave portion being formed on the growth surface, and a nitride semiconductor film grown on the growth surface; and a light emitting structure formed on the nitride semiconductor structure, the light emitting structure including an active layer comprising a nitride semiconductor;

wherein a cavity is formed between the nitride semiconductor film and the substrate of the nitride semiconductor structure in the concave portion.

11. A light emitting device or a laser device according to claim 10, wherein the convex portion and the concave portion of the nitride semiconductor structure comprise a plurality of parallel grooves.

12. A light emitting device or a laser device according to claim 11, wherein the plurality of grooves are formed along a <1-100> direction of the nitride semiconductor.

13. A light emitting device or a laser device according to claim 11, wherein the plurality of grooves are formed so as to extend along a cleavage plane or an etching stable plane of the substrate.

14. A light emitting device or a laser device according to claim 11, wherein the growth surface of the substrate of the nitride semiconductor structure comprises a nitride semiconductor formed on the substrate, and the plurality of grooves are formed along a <11-20> direction of the nitride semiconductor.

15. The light emitting device or laser device of claim 11, wherein the nitride semiconductor includes at least one element selected from the group consisting of B, As, P and Sb.

* * * * *